US012813330B2

(12) United States Patent
Tseng et al.

(10) Patent No.: US 12,813,330 B2
(45) Date of Patent: Nov. 24, 2026

(54) SEMICONDUCTOR DEVICE AND MANUFACTURING METHOD THEREOF

(71) Applicant: HON HAI PRECISION INDUSTRY CO., LTD., New Taipei City (TW)

(72) Inventors: Te-En Tseng, New Taipei City (TW); Hao-Chung Kuo, New Taipei City (TW); Jeng-Feng Lin, New Taipei City (TW)

(73) Assignee: HON HAI PRECISION INDUSTRY CO., LTD., New Taipei City (TW)

( * ) Notice: Subject to any disclaimer, the term of this patent is extended or adjusted under 35 U.S.C. 154(b) by 336 days.

(21) Appl. No.: 18/633,536

(22) Filed: Apr. 12, 2024

(65) Prior Publication Data

US 2025/0239498 A1 Jul. 24, 2025

(30) Foreign Application Priority Data

Jan. 24, 2024 (TW) ................................ 113102820

(51) Int. Cl.

| | |
|---|---|
| ***H10W 76/47*** | (2026.01) |
| ***H10H 20/851*** | (2025.01) |
| ***H10H 20/852*** | (2025.01) |
| ***H10W 90/00*** | (2026.01) |
| *H10H 20/01* | (2025.01) |

(52) U.S. Cl.

CPC ........ *H10W 76/47* (2026.01); *H10H 20/8512* (2025.01); *H10H 20/852* (2025.01); *H10W 90/00* (2026.01); *H10H 20/0361* (2025.01); *H10H 20/0362* (2025.01)

(58) Field of Classification Search

None

See application file for complete search history.

(56) References Cited

U.S. PATENT DOCUMENTS

| | | | | |
|---|---|---|---|---|
| 2015/0044759 A1* | 2/2015 | Lin | ........................ | G01N 21/01 435/287.2 |
| 2018/0082978 A1* | 3/2018 | Yu | ........................ | H10W 72/071 |
| 2020/0266177 A1 | 8/2020 | Hsieh et al. | | |
| 2020/0402924 A1* | 12/2020 | Wu | ........................ | H10D 1/692 |
| 2021/0249466 A1 | 8/2021 | Yang et al. | | |

(Continued)

FOREIGN PATENT DOCUMENTS

| | | |
|---|---|---|
| TW | 202138459 A | 10/2021 |
| TW | 202249305 A | 12/2022 |

*Primary Examiner* — Michelle Mandala

(74) *Attorney, Agent, or Firm* — CKC & Partners Co., LLC

(57) ABSTRACT

A semiconductor device includes a carrier board, a plurality of wall structures, a first barrier layer, a filling material, and a second barrier layer. The carrier board is made of a first material. The wall structures are arranged over the carrier board, in which the wall structures are made of a second material, and the first material is different from the second material. The first barrier layer covers a top surface of the carrier board and sidewalls of the wall structures. The filling material is over the first barrier layer and is between the wall structures, in which a compatibility between the filling material and the first barrier layer is higher than a compatibility between the filling material and the carrier board or a compatibility between the filling material and the wall structures. The second barrier layer is over the filling material.

10 Claims, 7 Drawing Sheets

(56) References Cited

U.S. PATENT DOCUMENTS

| | | | | |
|---|---|---|---|---|
| 2023/0163259 A1* | 5/2023 | Yang | H10H 20/8514 | |
| | | | 257/79 | |
| 2024/0063347 A1* | 2/2024 | Baeck | H10H 20/8513 | |
| 2025/0004181 A1* | 1/2025 | Peana | G02B 3/0056 | |

* cited by examiner

SEMICONDUCTOR DEVICE AND MANUFACTURING METHOD THEREOF

CROSS-REFERENCE TO RELATED APPLICATION

This application claims priority to Taiwan Application Serial Number 113102820, filed Jan. 24, 2024, which is herein incorporated by reference in its entirety.

BACKGROUND

Field of Disclosure

Some embodiments of the present disclosure relate to a semiconductor device and a manufacturing method thereof.

Description of Related Art

In recent technology, filling materials with different functions are used in various fields. For example, the filling materials may be used for package, wavelength conversion, etc. The filling materials with different functions may be formed by mixing the filling materials with functional substances. These functional substances tend to be affected by vapor, oxygen or other foreign substances, and thus be ineffective. Therefore, the filling materials should be protected to maintain the functions.

SUMMARY

Some embodiments of the present disclosure provides a semiconductor device including a carrier board, a plurality of wall structures, a first barrier layer, a filling material, and a second barrier layer. The carrier board is made of a first material. The wall structures are arranged over the carrier board, in which the wall structures are made of a second material, and the first material is different from the second material. The first barrier layer covers a top surface of the carrier board and sidewalls of the wall structures. The filling material is over the first barrier layer and is between the wall structures, in which a compatibility between the filling material and the first barrier layer is higher than a compatibility between the filling material and the carrier board or a compatibility between the filling material and the wall structures. The second barrier layer is over the filling material.

Some embodiments of the present disclosure provides a method of forming a semiconductor device, including providing a carrier board made of a first material, forming a plurality of wall structures over the carrier board, in which the wall structures are made of a second material, the first material is different from the second material, and the wall structures and a carrier board define a recess, forming a first barrier layer over the carrier board and wall structures, in which the first barrier layer conformal covers the carrier board and the wall structures, filling a filling material in the recess, in which a compatibility between the filling material and the first barrier layer is higher than a compatibility between the filling material and the carrier board or a compatibility between the filling material and the wall structures, and forming a second barrier layer over the filling material.

DETAILED DESCRIPTION

The present disclosure may be used to solve the problem related to different compatibility between a filling material and different materials in contact with the filling material in the semiconductor device. For example, compatibility of a filing material with different materials may be different, so it is difficult to obtain a filling material having a high compatibility with different materials simultaneously. In some embodiments of the present disclosure, the problem mentioned above will be solved. Some embodiments of the present disclosure are applicable for any semiconductor devices with the problem mentioned above.

Figure 1:
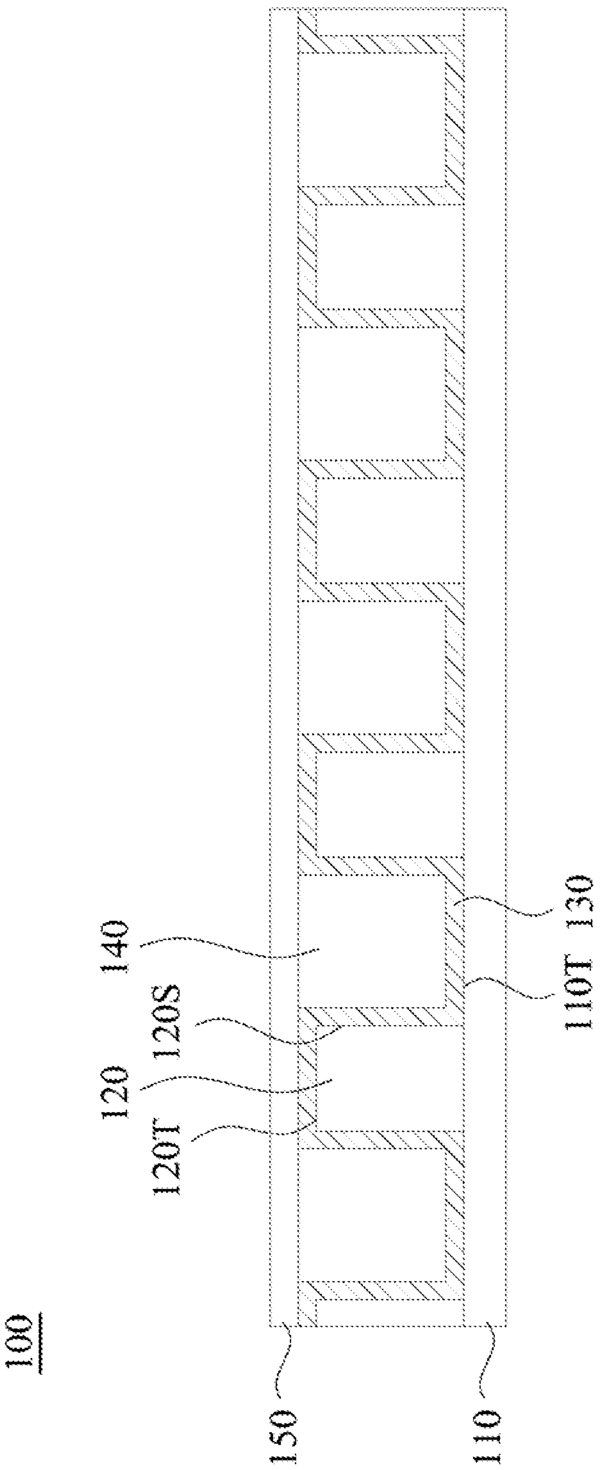
FIG. 1 illustrates a cross-section view of a semiconductor device 100 in some embodiments of the present disclosure.

FIG. 1 illustrates a cross-section view of a semiconductor device 100 in some embodiments of the present disclosure. The semiconductor device 100 includes a carrier board 110, wall structures 120, a first barrier layer 130, filling materials 140 and a second barrier layer 150. The carrier board 110 is made of a first material. The wall structures 120 are arranged over the carrier board 110. The wall structures 120 are made of a second material, and the first material is different from the second material. The first barrier layer 130 covers a top surface 110T of the carrier board 110 and sidewalls 120S of the wall structures 120. The filling materials 140 are over the first barrier layer 130 and are between the adjacent wall structures 120. The second barrier layer 150 is over the filling materials 140. The filling materials 140 are cladded by the first barrier layer 130 and the second barrier layer 150 completely. Therefore, the first barrier layer 130 and the second barrier layer 150 may prevent vapor, oxygen, or other foreign substances from entering the filling materials 140, thereby preventing the deterioration of the filling materials 140 or the interior materials. In some embodiments, the first barrier layer 130 extends form the top surface 110T of the carrier board 110 to the sidewalls 120S of the wall structures 120, and from the sidewalls 120S of the wall structures 120 to the top surfaces 120T of the wall structures 120. Alternatively, the first barrier layer 130 extends from bottoms surfaces of the filling materials 140 to the sidewalls of the filling materials 140, and further extends to the top surfaces 120T of the wall structures 120. The second barrier layer 150 extends from the top surfaces of the filling material 140 to the top surfaces 120T of the wall structures 120, and the first barrier layer 130 is in contact with the second barrier layer 150. The second barrier layer 150 is in contact with the top surfaces of the filling materials 140. Therefore, the filling material 140 are completely cladded, such that the filling materials 140 or the interior materials are more difficult to deteriorate.

The first barrier layer 130 may further be used the improve the issue related to the difficulty of forming the filling materials 140, which may resulting from different compatibility between the filling materials 140 and the carrier board 110 and between the filling materials 140 and the wall structures 120. Specifically, the carrier board 110 and the wall structures 120 are made of different materials, and the first material corresponding to the carrier board 110 and the second material corresponding to the wall structures 120 have relative compatibility, so the compatibility of the filling materials 140 with the carrier board 110 and the wall structures 120 are different. The term “compatibility” refers to the degree of adaptability between two different materials. For example, when a material is a hydrophilic material and another material is a hydrophobic material, the two materials have high compatibility (a certain degree of adsorptivity is between two materials). When two materials are both hydrophilic materials, the two materials have low compatibility. Alternatively, when two materials are both hydrophobic materials, the compatibility between two materials is lower (a certain degree of repellency is between two materials). In some embodiments, the carrier board 110 is one of the hydrophobic material and the hydrophilic material, and the wall structures 120 are the other one of the hydrophobic material and the hydrophilic material. For example, in some embodiments, the carrier board 110 is hydrophobic material, and the wall structures 120 are hydrophilic material. When the filling materials 140 are hydrophobic material, the compatibility between the filling materials 140 and the carrier board 110 is low, and the compatibility between the filling material 140 and the wall structures 120 is high. On the other hands, when the filling materials 140 are hydrophilic material, the compatibility between the filling materials 140 and the carrier board 110 is high, and the compatibility between the filling material 140 and the wall structures 120 is low. As a result, if the filling material 140 is in contact with the carrier board 110 and the wall structures 120 (which are hydrophobic and hydrophilic respectively) simultaneously, it is difficult to select a filling material 140 having high compatibility with both carrier board 110 and wall structures 120.

Therefore, the first barrier layer 130 is formed between the filling materials 140 and the carrier board 110 and between the filling material 140 and the wall structure 120 in the present disclosure, such that the filling materials 140 are only in contact with one kind of material. As a result, the properties of the filling materials 140 may be adjusted based on the surface properties of the first barrier layer 130, and there is no need to consider the compatibility of the filling materials 140 with more than two kinds of the materials. That is, the compatibility between the filling materials 140 and the first barrier layer 130 is better than (higher than) the compatibility between the filling materials 140 and the carrier board 110 or the compatibility between the filling materials 140 and the wall structures 120. In some embodiments, if the first barrier layer 130 is hydrophobic material and the filling materials 140 are hydrophilic material, the compatibility between first barrier layer 130 and the filling materials 140 is high. In some other embodiments, if the first barrier layer 130 is hydrophilic material and the filling materials 140 are hydrophobic material, the compatibility between first barrier layer 130 and the filling materials 140 is high.

According to some other embodiments of the present disclosure, the first barrier layer 130 includes at least two barrier sublayers, and at least two barrier sublayers are stacked. For example, the first barrier layer 130 further includes a first barrier sublayer and a second barrier sublayer. The first barrier sublayer covers the top surface 110T of the carrier board 110 and the sidewalls 120S of the wall structures 120. The first barrier sublayer may extend from the top surface 110T of the carrier board 110 to the sidewalls 120S of the wall structures 120, and extend from the sidewalls 120S of the wall structures 120 to the top surfaces 120T of the wall structures 120. The second barrier sublayer covers the first barrier sublayer. Optionally, the second barrier sublayer may conformally cover the first barrier sublayer. The compatibility between the filling materials 140 and the second barrier sublayer is better than (higher than) the compatibility between the filling materials 140 and the carrier board 110 or the compatibility between the filling materials 140 and the wall structures 120. In some embodiments where the first barrier layer 130 includes 3 or more barrier sublayers, the compatibility between the sublayer in contact with the filling materials 140 and the filling materials 140 is better than (higher than) a compatibility between the filling materials 140 and the carrier board 110 or the compatibility between the filling materials 140 and the wall structures 120. The definition of the compatibility is discussed in previous description, and is not described repeatedly. According to some embodiments of the present disclosure, the barrier layer may be made of $SiO_2$, $SiO_x$, $Al_2O_3$, $AlO_x$, $SiN_x$, $Ga_2O_3$, ZnO, AlTiO, ZnAlO, or other materials. Moreover, if the index of refraction of the barrier layer is taken into consideration, the barrier layer with high index of refraction may be made of $ZrO_2$, $HfO_2$, $Ta_2O_5$, $TiO_2$, $Nb_2O_5$, $Ga_2O_3$, GaN, ZnO, or other materials, and the barrier layer with low index of refraction may be made of MgO, $MgF_2$, $CaF_2$, $SiO_2$, $Al_2O_3$ or other material.

Figure 2:
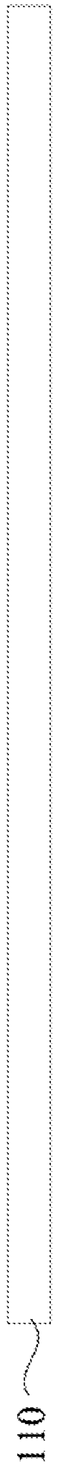
FIGS. 2-6 are cross-sectional views of a process of a semiconductor device according to some embodiments of the present disclosure.
Figure 3:
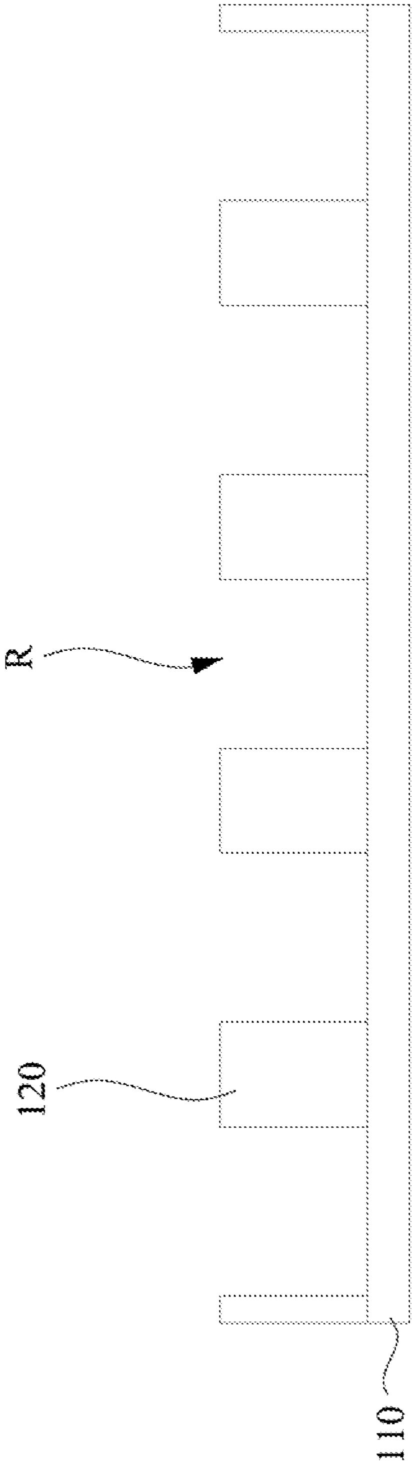

FIGS. 2-6 illustrate cross section views of forming a semiconductor device in some embodiments of the present disclosure. Referring to FIG. 2, a carrier board 110 made of a first material is provided. Subsequently, referring to FIG. 3, wall structures 120 are formed over the carrier board 110, the wall structures 120 are made of a second material, and the first material is different from the second material. In some embodiments, the wall structures 120 may be formed by firstly formed a material layer over the carrier board 110, and then etching the material layer. The wall structures 120 and the carrier board 110 define recesses R. The aspect ratio of the recesses R is determined based on different situation. In some embodiments, the aspect ratio of the recesses R may be about 1:1 as shown in FIG. 3. However, the aspect ratio of the recesses R is not limited in the present disclosure. In some embodiments, the recesses R have high aspect ratio.

Figure 4:
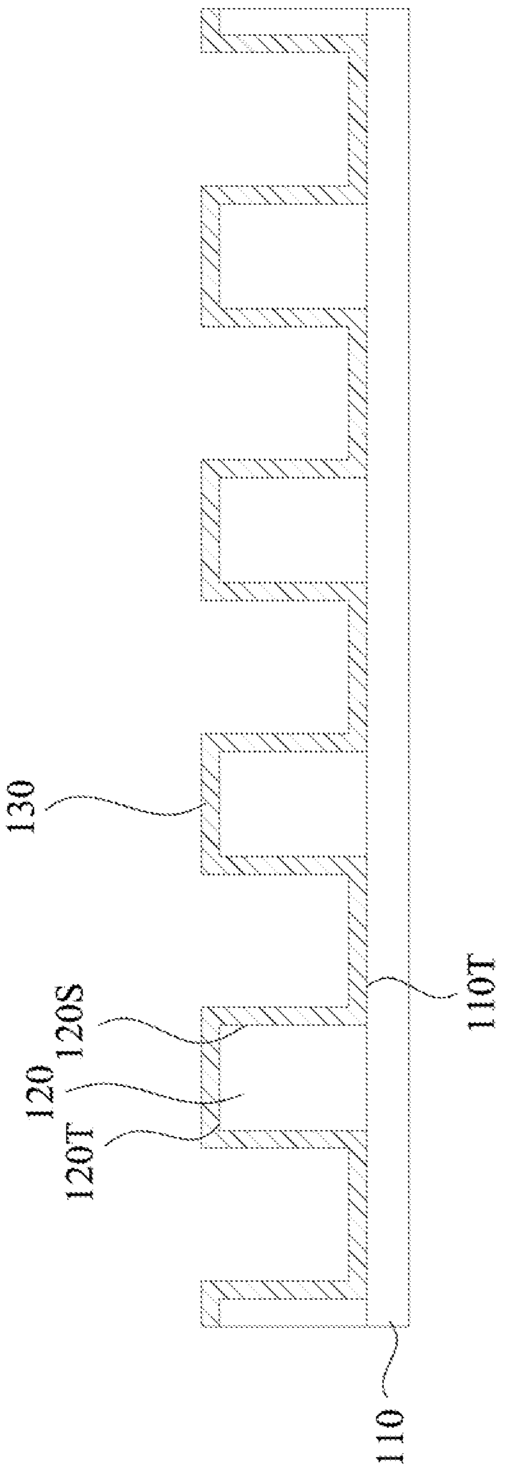

Referring to FIG. 4, subsequently, in some embodiments (the embodiments where the first barrier layer 130 includes one barrier sublayer), a first barrier layer 130 is formed over the carrier board 110 and the wall structures 120. The first barrier layer 130 conformally covers the carrier board 110 and the wall structures 120. In some embodiments, the first barrier layer 130 is formed by atomic layer deposition. The first barrier layer 130 may extend from the top surface 110T of the carrier board 110 to the sidewalls 120S of the wall structures 120, and extend from the sidewalls 120S of the wall structures 120 to the top surfaces 120T of the wall structures 120. In some embodiments, the wall structures 120 are completely covered by the first barrier layer 130.

In some other embodiments (the embodiments where the first barrier layer 130 includes two or more barrier sublayers), a first barrier layer 130 is formed over the carrier board 110 and the wall structures 120. Forming the first barrier layer 130 includes forming a first barrier sublayer over the carrier board 110 and the wall structures 120, and then forming the second barrier sublayer over the first barrier sublayer. The first barrier sublayer may extend from the top surface 110T of the carrier board 110 to the sidewalls 120S of the wall structures 120, and extend from the sidewalls 120S of the wall structures 120 to the top surfaces 120T of the wall structures 120. The second barrier sublayer conformally covers the first barrier sublayer. The first barrier sublayer and the second barrier sublayer are made of different materials. In some embodiments, the first barrier sublayer and the second barrier sublayer of the first barrier layer 130 are formed by atomic layer deposition.

Figure 5:
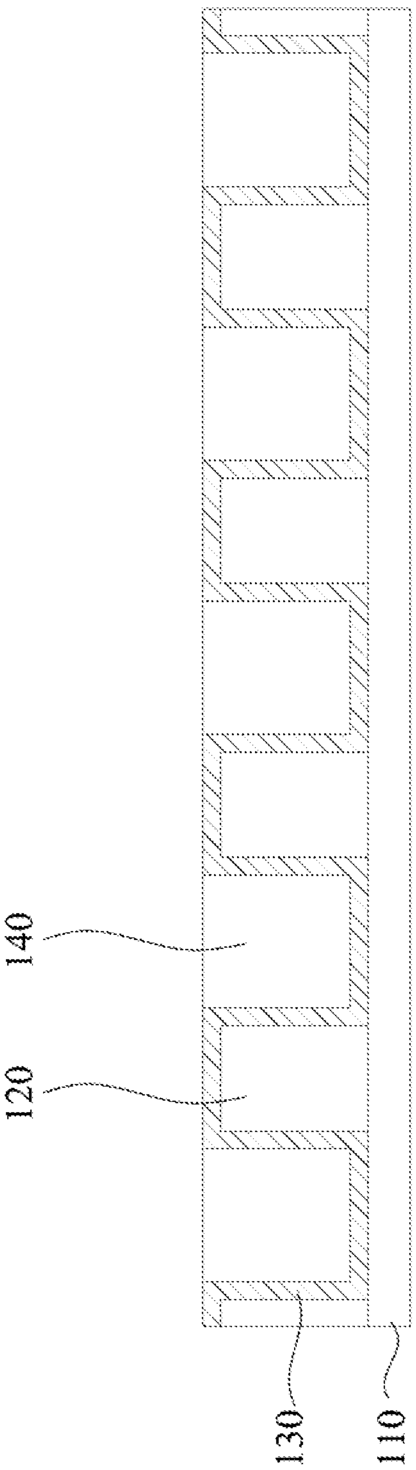

Referring to FIG. 5, filling materials 140 are filled in the recesses R (FIG. 3), and the compatibility between the filling materials 140 and the first barrier layer 130 is better than (higher than) the compatibility between the filling materials 140 and the carrier board 110 or the compatibility between the filling materials 140 and the wall structures 120. Specifically, the filling materials 140 may be photoresist, gel or other substance. If the first barrier layer 130 is not provided, the filling materials 140 are in contact with the carrier board 110 and the wall structures 120. The difference between the compatibility between the filling material 140 and the carrier board 110 and the compatibility between the filling materials 140 and the wall structures 120 may be significant. For example, the carrier board 110 may be hydrophobic material and the wall structures 120 may be hydrophilic material, or the carrier board 110 may be hydrophilic material and the wall structures 120 may be hydrophobic material. Therefore, it is difficult to select a filling material 140 having high compatibility with both carrier board 110 and wall structures 120. In the present disclosure, since the filling materials 140 are only in contact with the first barrier layer 130, the properties of the filling material 140 are adjusted based on the material of the first barrier layer 130 only. The filling material 140 having a higher compatibility with the first barrier layer 130 is formed accordingly.

Figure 6:
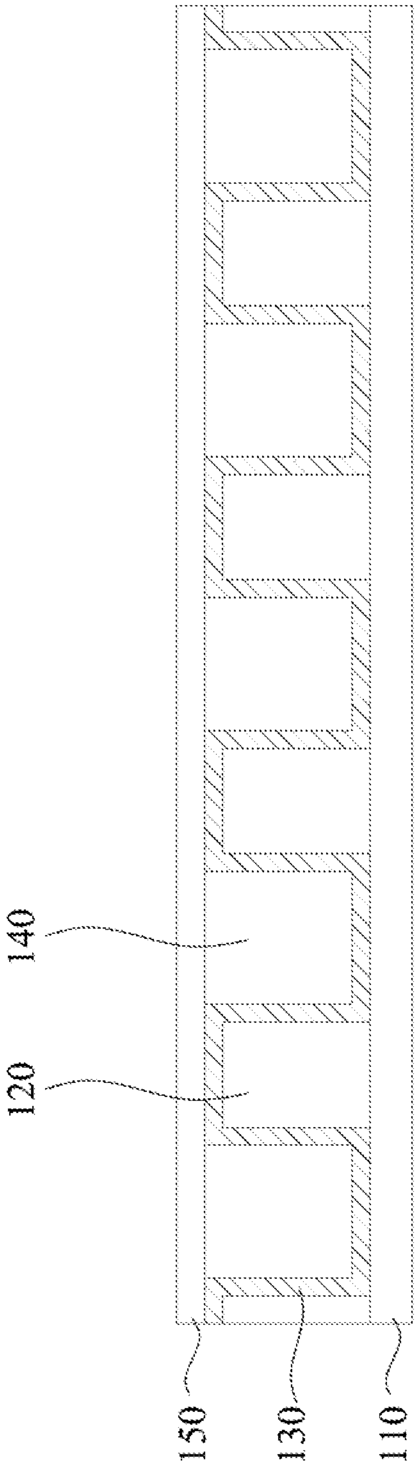

Referring to FIG. 6, a second barrier layer 150 is formed over the filling materials 140. In some embodiments, the second barrier layer 150 is formed by atomic layer deposition. The second barrier layer 150 may further extend to the top surface of the first barrier layer 130 and be in contact with the first barrier layer 130. As a result, the filling materials 140 are completely cladded by the first barrier layer 130 and the second barrier layer 150. Therefore, the first barrier layer 130 and the second barrier layer 150 can prevent vapor, oxygen or other foreign substances from entering the filling materials 140. In some embodiments, the first barrier layer 130 and the second barrier layer 150 are made of the same material. In some other embodiments, the first barrier layer 130 and the second barrier layer 150 are made of different materials.

Figure 7:
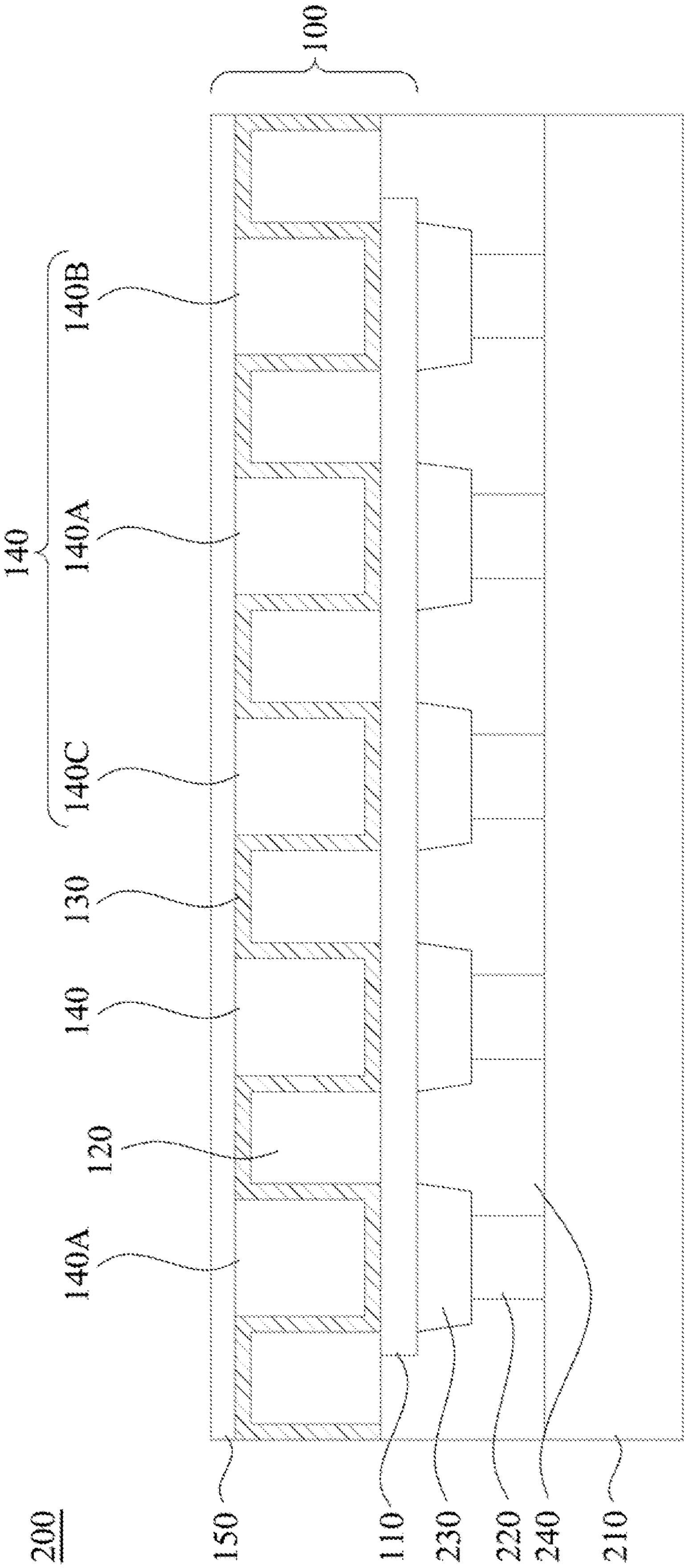
FIG. 7 illustrates an example including the semiconductor device 100 in some embodiments of the present disclosure.

FIG. 7 illustrates an example including the semiconductor device 100 in some embodiments of the present disclosure. FIG. 7 illustrates a display 200. The display 200 may include a carrier board 210, conductive pads 220, light-emitting diode chips 230, an encapsulation layer 240 and the semiconductor device 100. The conductive pads 220 are arranged over the carrier board 210. The light-emitting diode chips 230 are over the conductive pads 220, and the conductive pads 220 are used to provide the electrical connection between the light-emitting diode chips 230 and the carrier board 210. The encapsulation layer 240 surrounds the conductive pads 220 and the light-emitting diode chips 230. The semiconductor device 100 is over the light-emitting diode chips 230.

In the embodiments in FIG. 7, the carrier board 110 may be a LED substrate, and the carrier board 110 is connected to the light-emitting diode chips 230. The material of the carrier board 110 and the material of the light-emitting diode chips 230 may be the same. In some embodiments, the carrier board 110 may be made of GaN. The filling materials 140 may further includes a first filling material 140A, a second filling material 140B and a third filling material 140C, and are disposed corresponding to different light-emitting diode chips 230. The first filling material 140A, the second filling material 140B and the third filling material 140C may be wavelength conversion layers or gel layers, and may include photoresist and quantum dots in the photoresist. In some embodiments, at least one of the first filling material 140A, the second filling material 140B and the third filling material 140C may include quantum dots, for example, the first filling material 140A and the filling material 140B may include quantum dots, and the third filling material 140C may not include quantum dots. The wall structures 120 may be highly reflective metal layers. The first filling material 140A, the second filling material 140B and the third filling material 140C are disposed over the corresponding light-emitting diode chips 230 respectively, and the wall structures 120 surround the first filling material 140A, the second filling material 140B and the third filling material 140C respectively. When the light-emitting diode chips 230 emit light, the light pass the carrier board 110 and reach the first filling material 140A, the second filling material 140B and the third filling material 140C, and is converted into light with different wavelength by the quantum dots in the first filling material 140A, the second filling material 140B and the third filling material 140C. For example, when the light-emitting diode chips 230 are blue light-emitting diode chips, the first filling material 140A is a red light wavelength conversion layer, the second filling material 140B is a green light wavelength conversion layer, and the third filling material 140C is a gel layer, the first filling material 140A may convert blue light emitted from the light-emitting diode chip 230 into red light, the second filling material 140B may convert blue light emitted from the light-emitting diode chip 230 into green light, and the third filling material 140C may allow blue light emitted from the light-emitting diode chip 230 to directly pass through the third filling material 140C without undergoing any wavelength conversion. The wall structures 120 may reflect the wavelength-converted light, such that the light remains emitting upwardly. When the filling materials 140 include quantum dots for wavelength conversion, the quantum dots is easily affected and damaged by vapor, oxygen or other foreign substances. Therefore, when the first barrier layer 130 and the second barrier layer 150 completely cover the top surface, the sidewall, and the bottom surface of the filling material 140, the first barrier layer 130 and the second barrier layer 150 may prevent vapor, oxygen or other foreign substances from entering the filling materials 140 to damage the quantum dots. In some embodiments, the first barrier layer 130 and the second barrier layer 150 are layers transparent to light, such as aluminum oxide. Therefore, even the first barrier layer 130 is between the light-emitting diode chips 230 and the first filling material 140A, the second filling material 140B and the third filling material 140C, the second barrier layer 150 is over the first filling material 140A, the second filling material 140B and the third filling material 140C, the light emitted from the light-emitting diode chips 230 still pass through the first barrier layer 130, the first filling material 140A, the second filling material 140B and the third filling material 140C, and will not affect the light emitted from the light-emitting diode chips 230.

According to some other embodiments of the present disclosure, when the first barrier layer 130 includes multiple sublayers, the first barrier layer 130 may be used as distributed Bragg reflector (DBR).

In the embodiments in FIG. 7, the carrier board 110 is made of GaN and is hydrophobic material, and the wall structures 120 are made of metal, such as aluminum, and are hydrophilic material. If the filling materials 140 are hydrophobic material, the filling materials 140 have high compatibility with the wall structures 120 but low compatibility with the carrier board 110. If the filling materials 140 are hydrophilic material, the filling materials 140 have low compatibility with the wall structures 120 but high compatibility with the carrier board 110. If the first barrier layer 130 covers the carrier board 110 and the wall structures 120, the filling materials 140 having high compatibility with the first barrier layer 130 may be formed based on the surface properties of the first barrier layer 130, and the manufacturing process of the semiconductor device 100 may be simplified. It is noted that although FIG. 7 take a display as example, the present disclosure is not limited thereto. Any embodiments disclosed in FIGS. 1-6 are protected by the present disclosure.

As mentioned above, the semiconductor device in some embodiments of the present disclosure includes the first barrier layer and the second barrier layer. The first barrier layer and the second barrier layer completely clad the filling materials to prevent vapor, oxygen or the foreign substances from entering the filling materials to damage the filling materials. Moreover, the first barrier layer is formed between the filling materials and the other two kinds of the materials. As a result, the filling materials are only in contact with the first barrier layer, the filling materials having a higher compatibility with the first barrier layer are formed based on the surface properties of the first barrier layer only. There is no need to consider the compatibility of the filling materials with more than two kinds of the materials.

What is claimed is:

1. A semiconductor device, comprising:

a plurality of light-emitting diodes;

a carrier board over the light-emitting diodes, wherein the carrier board is made of a first material;

a plurality of wall structures arranged over the carrier board, wherein the wall structures are made of a second material, and the first material is different from the second material;

a first barrier layer covering a top surface of the carrier board and sidewalls of the wall structures;

a plurality of filling materials over the plurality of light-emitting diodes correspondingly and the first barrier layer and are between the wall structures, wherein the plurality of the filling materials comprise a quantum dot, and a compatibility between the filling material and the first barrier layer is higher than a compatibility between the filling material and the carrier board or a compatibility between the filling material and the wall structures; and a second barrier layer over the plurality of the filling materials.

2. The semiconductor device according to claim 1, wherein the first barrier layer extends from a bottom surface of one of the plurality of filling materials to a sidewall of the one of the plurality of filling materials.

3. The semiconductor device according to claim 2, wherein the first barrier layer further extends to a top surface of the wall structures, and the second barrier layer further covers the first barrier layer extending to the top surface of the wall structures.

4. The semiconductor device according to claim 1, wherein the carrier board is one of a hydrophobic material and hydrophilic material, and the wall structures are the other of the hydrophobic material and the hydrophilic material.

5. The semiconductor device according to claim 1, wherein the first barrier layer comprises at least two barrier sublayers, and the at least two barrier sublayers are stacked.

6. The semiconductor device according to claim 5, wherein a compatibility between the barrier sublayer in contact with the plurality of filling materials and the plurality of filling materials is higher than a compatibility between the plurality of filling materials and the carrier board or the compatibility between the plurality of filling materials and the wall structures.

7. A method of manufacturing a semiconductor device, comprising:

providing a carrier board made of a first material over a plurality of light-emitting diodes;

forming a plurality of wall structures over the carrier board, wherein the wall structures are made of a second material, the first material is different from the second material, and the wall structures and a carrier board define recesses over the plurality of light-emitting diodes;

forming a first barrier layer over the carrier board and wall structures, wherein the first barrier layer conformal covers the carrier board and the wall structures;

filling a plurality of filling materials in the recesses and over the first barrier layer, such that the plurality of filling materials are over the plurality of light-emitting diodes correspondingly, wherein the plurality of the filling materials comprise a quantum dot, and a compatibility between the filling material and the first barrier layer is higher than a compatibility between the filling material and the carrier board or a compatibility between the filling material and the wall structures; and forming a second barrier layer over the plurality of filling materials.

8. The method according to claim 7, wherein the carrier board is one of a hydrophobic material and a hydrophilic material, and the wall structures are the other of the hydrophobic material and the hydrophilic material.

9. The method according to claim 7, wherein the first barrier layer comprises at least two barrier sublayers, and the at least two barrier sublayers are stacked.

10. The method according to claim 1, wherein a compatibility between the sublayer in contact with the plurality of filling materials and the plurality of filling materials is higher than a compatibility between the plurality of filling materials and the carrier board or the compatibility between the plurality of filling materials and the wall structures.

* * * * *